(12) United States Patent
Norman

(10) Patent No.: US 7,796,451 B2
(45) Date of Patent: Sep. 14, 2010

(54) INTEGRATED CIRCUITS AND METHODS TO COMPENSATE FOR DEFECTIVE MEMORY IN MULTIPLE LAYERS OF MEMORY

(75) Inventor: Robert Norman, Pendleton, OR (US)

(73) Assignee: Unity Semiconductor Corporation

( * ) Notice: Subject to any disclaimer, the term of this patent is extended or adjusted under 35 U.S.C. 154(b) by 413 days.

(21) Appl. No.: 12/001,335

(22) Filed: Dec. 10, 2007

(65) Prior Publication Data
US 2009/0147598 A1 Jun. 11, 2009

(51) Int. Cl.
*G11C 29/00* (2006.01)
(52) U.S. Cl. ............... 365/200; 365/185.09; 365/210.1
(58) Field of Classification Search .............. 365/200, 365/185.09, 210.1
See application file for complete search history.

(56) References Cited

U.S. PATENT DOCUMENTS

| 7,327,600 B2 | 2/2008 | Norman | |
| 7,474,576 B2* | 1/2009 | Co et al. | 365/201 |
| 7,492,660 B2* | 2/2009 | Harari et al. | 365/230.03 |
| 7,593,284 B2 | 9/2009 | Norman | |
| 7,633,789 B2 | 12/2009 | Norman | |
| 2006/0028864 A1* | 2/2006 | Rinerson et al. | 365/158 |
| 2008/0005459 A1 | 1/2008 | Norman | |
| 2008/0084727 A1 | 4/2008 | Norman | |
| 2008/0175072 A1 | 7/2008 | Norman | |
| 2009/0048819 A1 | 2/2009 | Norman | |
| 2009/0049274 A1 | 2/2009 | Norman | |
| 2009/0144583 A1* | 6/2009 | Bruennert et al. | 714/7 |

* cited by examiner

*Primary Examiner*—Tuan T Nguyen
*Assistant Examiner*—Toan Le

(57) ABSTRACT

Embodiments of the invention relate generally to data storage and computer memory, and more particularly, to systems, integrated circuits and methods to compensate for defective memory in third dimension memory technology. In a specific embodiment, an integrated circuit is configured to compensate for defective memory cells. For example, the integrated circuit can include a memory having memory cells that are disposed in multiple layers of memory. It can also include a memory reclamation circuit configured to substitute a subset of the memory cells for one or more defective memory cells. At least one memory cell in the subset of the memory cells resides in a different plane in the memory than at least one of the one or more defective memory cells.

41 Claims, 8 Drawing Sheets

INTEGRATED CIRCUITS AND METHODS TO COMPENSATE FOR DEFECTIVE MEMORY IN MULTIPLE LAYERS OF MEMORY

CROSS-REFERENCE TO RELATED APPLICATIONS

This application incorporates by reference the following related application: U.S. patent application Ser. No. 11/095,026, filed Mar. 30, 2005, and titled "Memory Using Mixed Valence Conductive Oxides," which has published as U.S. Pub. No. 20060171200.

FIELD OF THE INVENTION

Embodiments of the invention relate generally to data storage and computer memory, and more particularly, to systems, integrated circuits and methods for compensating for defective memory in multiple layers of memory implementing, for example, third dimension memory technology.

BACKGROUND OF THE INVENTION

Conventional semiconductor fabrication processes have reduced device geometries in the x, y and z directions so as to facilitate the fabrication of relatively dense memory cells. Memories having higher densities, however, are vulnerable to increased defect rates (e.g., defects per unit area). To salvage memory that otherwise would be lost due to defects, memory designers usually include extra memory to replace defective memory.

A common approach to salvaging memory divides a memory into multiple, equivalently-sized groupings in which each row in a grouping is a separate, isolated collection of memory cells. A Flash memory array, for example, can be partitioned into four equal areas. By partitioning memory in this manner, a memory is less susceptible to fatal defects that otherwise render the entire memory (i.e., the aggregate of all groupings) inoperative. To illustrate, consider that a defect in an unpartitioned memory causes an entire column to fail. As such, the entire memory array is unusable. But if the memory is partitioned, the defect will at most affect only the grouping in which the defect resides. This allows the memory to remain usable, albeit with less memory capacity. To recover lost memory, some memories traditionally include extra rows in each grouping to replace a limited number of rows having defects. These extra rows are typically selected by programming bits stored in non-volatile registers to indicate which one of a number of substitute alternate rows will be used to replace a defective row. Therefore, each grouping is usually associated with a dedicated set of non-volatile registers. Further, each grouping usually includes an extra decoder to uniquely select each of the extra rows.

While this approach is functional, it has its drawbacks. First, extra rows, non-volatile registers, and extra decoders, if used, collectively consume amounts of surface area in traditional memory architectures. This, in turn, increases the die size (i.e., in the X and Y dimensions). Second, memory designers are typically faced with deciding how many extra memory rows to add to each grouping, especially since memory fabrication processes can randomly cause any number of unforeseen defects. If a memory designer adds too many extra rows, then any unused memory that does not remedy a defect will unnecessarily increase the die size. But if the memory designer adds too few extra rows, then the memory array cannot support its intended memory capacity, which decreases the yield of good memories. Third, conventional row replacement techniques, as described above, do not usually adapt to the different defects rates that each grouping experiences. For example, consider that each of eight groupings includes five extra rows to replace five defective rows, if necessary. Next, consider that a fabrication process introduces defects in each memory as follows: one of the eight groupings has six defective rows while the other groupings have two defective rows. As is common, the extra rows in the other groupings cannot be used to replace the sixth defective row, and, thus, that row renders its grouping inoperative. Fourth, accessing the extra rows using conventional row replacement techniques can ordinarily have longer access times than accessing the main array, especially if the detection of defects and implementation of the extra rows are performed, for example, serially.

There are continuing efforts to improve techniques, systems and devices for compensating for defects in memory.

BRIEF DESCRIPTION OF THE FIGURES

The invention and its various embodiments are more fully appreciated in connection with the following detailed description taken in conjunction with the accompanying drawings, in which.

Figure 1:
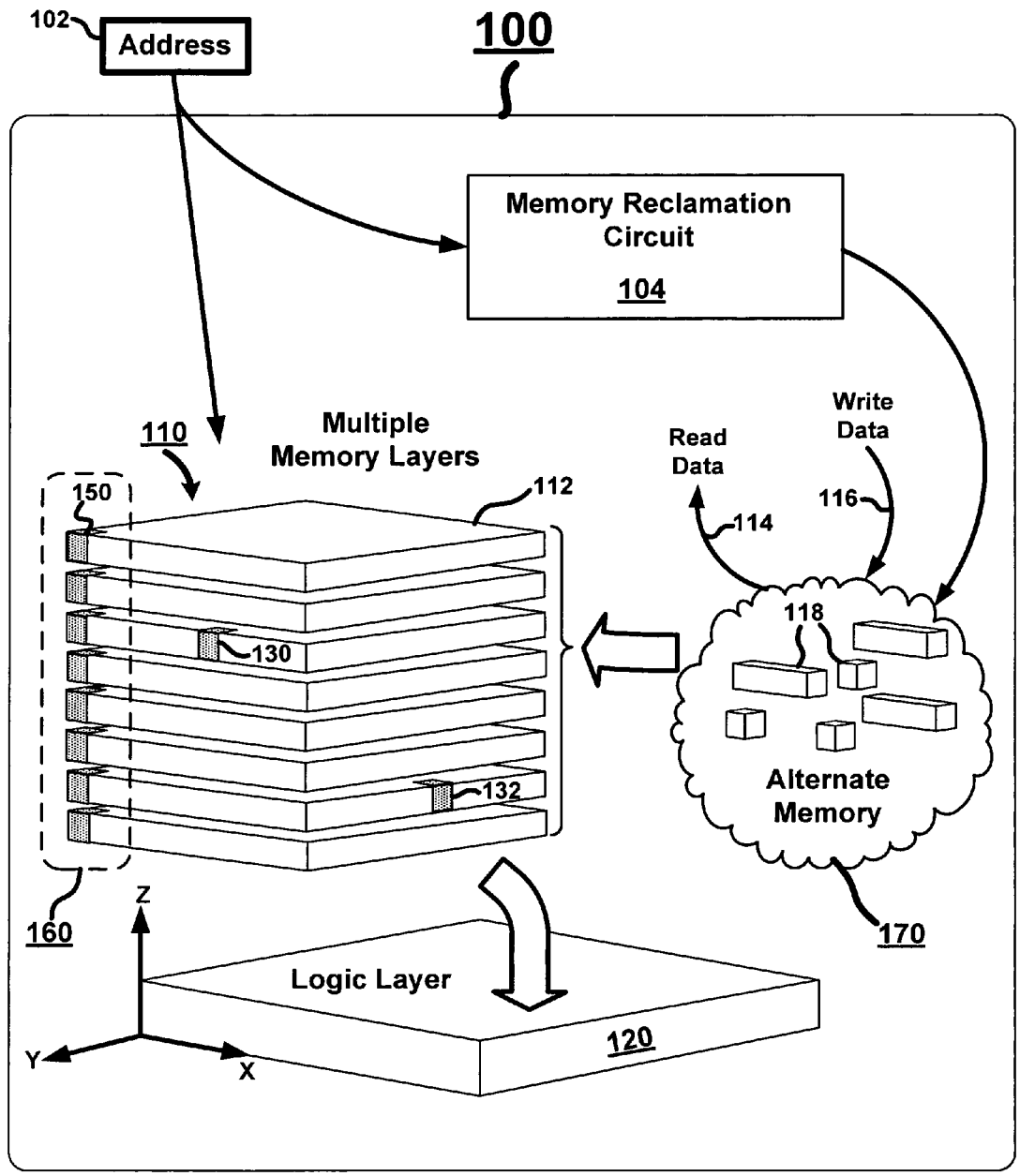
FIG. 1 illustrates an integrated circuit implementing a memory reclamation circuit configured to compensate for defects in a memory composed of multiple memory layers, according to at least one embodiment of the invention.

Like reference numerals refer to corresponding parts throughout the several views of the drawings. Note that most of the reference numerals include one or two left-most digits that generally identify the figure that first introduces that reference number. Although the Drawings depict various examples of the invention, the invention is not limited by the depicted examples. Furthermore, the depictions are not necessarily to scale.

DETAILED DESCRIPTION

FIG. 1 illustrates an integrated circuit implementing a memory reclamation circuit configured to compensate for defects in a memory composed of multiple memory layers, according to at least one embodiment of the invention. Integrated circuit 100 includes a memory reclamation circuit 104, a memory 110 including multiple memory layers 112 formed on top of each other (e.g., in the Z dimension), alternate memory 170 and a logic layer 120. Memory 112 is configured to reclaim memory that otherwise would be unavailable due to, for example, defects. As shown, multiple layers of memory 112 can include subsets 118 of alternate memory 170, each including any number of memory cells that operate as substitute memory for defective memory cells. In one embodiment, at least one memory cell in a subset 118 of memory cells can reside in a different plane in memory 110 than at least one defective memory cell. For example, one or more memory cells 132, which form a subset 118 of alternate memory 170, can reside in a different plane than one or more defective memory cells 130. As used herein, a "plane" refers, at least in one embodiment, to a flat, conceptual surface passing containing, for example, the X and Y axes, the Y and Z axes, or the Z and X axes, as well as any similar surface that is parallel to any of the aforementioned axes. Memory reclamation circuit 104 is configured to substitute a subset 118 of memory cells for one or more defective memory cells in memory 110, whereby the defective memory cells and the substitute memory cells in subsets 118 can be distributed anywhere throughout multiple memory layers 112 of memory 110.

In view of the foregoing, a designer can add alternate memory 170 in memory 110 without increasing the die size of, for example, logic layer 120 or the substrate (not shown) upon which logic layer 120 is formed. Specifically, adding alternate memory 170 in multiple layers of memory 112 predominantly affects the Z dimension of integrated circuit 100 rather than the X and Y dimensions. As such, implementation of alternate memory 170 facilitates defective memory replacement without increasing the die size to include alternate memory 170 in logic layer 120 or on the substrate.

Also, memory reclamation circuit 104 is further configured to implement subsets 118 of memory cells, which can be located anywhere in memory 110, to replace defective memory cells, which also can be located anywhere in memory 110. As such, integrated circuit 100 can implement more subsets 118 of memory cells to reclaim a higher concentration of memory cells succumbing to defects in certain regions, and can implement fewer subsets 118 of memory cells for substituting defective memory in other regions that have a lower concentration of defects. In at least one instance, memory reclamation circuit 104 can vary an amount of memory cells in alternate memory 170 to reclaim memory in different regions having different numbers of defects per region, thereby obviating the segregation of fixed number of substitute memory cells in a fixed relationship to separate parts of a memory. This improves the usage of substitute memory that otherwise might be unused. As used herein, a "region" in memory refers, at least in one embodiment, to a grouping of memory cells with which a rate of defects (e.g., a number of defects per unit region) can be determined. For example, a region can be any layer of multiple layers 112, any row in a layer, any packet (e.g., number of bits or memory cells) in a row, as well as any volume that includes memory cells in, for example, a portion of each layer in a subset of multiple layers 112.

Further, memory reclamation circuit 104 can be configured to detect an access to defective memory cells 130, and, in response, divert the access to a subset 118 of memory cells, whereby the diversion is in parallel, or is substantially in parallel, with the access. This is at least in part due to the collaboration of third dimension memories, which have relatively small sizes and fast access times, with memory reclamation circuit 104. As such, a user will generally not experience noticeably different time delays between memory cells in the main arrays of memory 110 and in alternate memory 170. Additionally, parallel access to alternate memory 170 facilitates expeditious compensation of defective memory, which otherwise might not be the case. As used herein, an "access" refers, at least in one embodiment, to a data operation, such as a write operation (e.g., applying write data 116), a read operation e.g., retrieving read data 114), or any other memory operation. In a specific embodiment, memory reclamation circuit 104 functions to at least detect an address 102 of an access to a defective memory cell. In at least one embodiment, memory reclamation circuit 104 is a single memory reclamation circuit serving memory reclamation for all of memory 110.

In at least one embodiment, the memory cells of memory 110 are third dimension memory cells. U.S. patent application Ser. No. 11/095,026, filed Mar. 30, 2005, U.S. Published Application No. 2006/0171200, and titled "Memory Using Mixed Valence Conductive Oxides," is hereby incorporated by reference to describe one example of a third dimension memory cell. A memory is "third dimension memory" when it is fabricated above other circuitry components, the components usually including a silicon substrate, polysilicon layers and, typically, metallization layers. By using non-volatile third dimension memory arrays, memory systems can be vertically configured to reduce die size and while preserving overall functionality of an integrated circuit. In at least one instance, a third dimension cell can be a two-terminal memory element that changes conductivity as a function of a voltage differential between a first terminal and a second terminal. In some instances, the third dimension cell can be formed with an electrolytic tunnel barrier and a mixed valence conductive oxide. A voltage drop across the electrolytic tunnel barrier causes an electrical field within the mixed valence conductive oxide that is strong enough to move oxygen ions out of the mixed valence conductive oxide and into the electrolytic tunnel barrier. Oxygen depletion causes the mixed valence conductive oxide to change its valence, which causes a change in conductivity. Data can be stored in the two-terminal memory element as a plurality of conductivity profiles that can be sensed (e.g., as a read current) by applying a read voltage across the two-terminal memory element. Both the electrolytic tunnel barrier and the mixed valence conductive oxide do not need to operate in a silicon substrate, and, therefore, can be fabricated above circuitry being used for other purposes (such as selection circuitry).

Further, third dimension memory cells in memory 110 can be produced with equivalent fabrication processes that produce logic layer 120. As such, both can be manufactured in the same or different fabrication plants, or "fabs," to form integrated circuit 100 on a single substrate. This enables a manufacturer to first fabricate logic layer 120 using a CMOS process in a first fab, and then port logic layer 120 to a second fab at which additional CMOS processing can be used to fabricate multiple memory layers 112 directly on top of logic layer 120. Note that memory 110 can be vertically stacked on top of logic layer 120 without an intervening substrate. In at least one embodiment, multiple memory layers 112 are fabricated to arrange the third dimension memory cells in a stacked cross point array. In particular, two-terminal memory elements can be arranged in a cross point array such that one terminal is electrically coupled with an X-direction line and the other terminal is electrically coupled with a Y-direction line. A stacked cross point array includes multiple cross point arrays stacked upon one another, sometimes sharing X-direction and Y-direction lines between layers 112, and sometimes having isolated lines. Both single-layer cross point arrays and stacked cross point arrays may be arranged as third dimension memories.

Note that memory 110, which can also be referred to as a "memory array," in some embodiments, can be implemented using layers 112 of memory elements arranged in blocks or sub-blocks to store data. By utilizing third dimension memory, driving voltage requirements can be met by using multiple, smaller charge pumps in some cases. Further, multiple, simultaneous accesses of memory elements in a memory array can be performed. While various types and designs of charge pump circuits can be used, the implementation of multiple, smaller charge pumps in a third dimension memory allows for die size to be reduced while improving the capabilities of integrate circuit 100, such as faster access times for performing multiple, simultaneous programmable sequences.

In one embodiment, subsets 118 of memory cells in alternate memory 170 can have one or more spatial arrangements that are different than that of one or more defective memory cells. As used herein, a "spatial arrangement" of memory cells can refer, at least in one embodiment, to an arrangement of specific numbers of memory cells that are located and/or oriented differently from the defective memory cells. And an arrangement of memory cells as one of subsets 118 can constitute any of the following: an extra layer of third dimension memory cells 112, a spare row (or sector) in a layer 112, a spare portion of a row, such as a packet (e.g., any number of bits), a spare block of memory, and any other arrangement of memory cells. For example, consider that one row of substitute memory cells can be located in a different layer 112 than a row that includes a defective memory, whereby the one row of substitute memory cells can replace the row in memory 110 that contains the defect. As another example, a spare row can be oriented as vertical row 160, which is composed of vertically-stacked memory cells 150.

Figure 2:
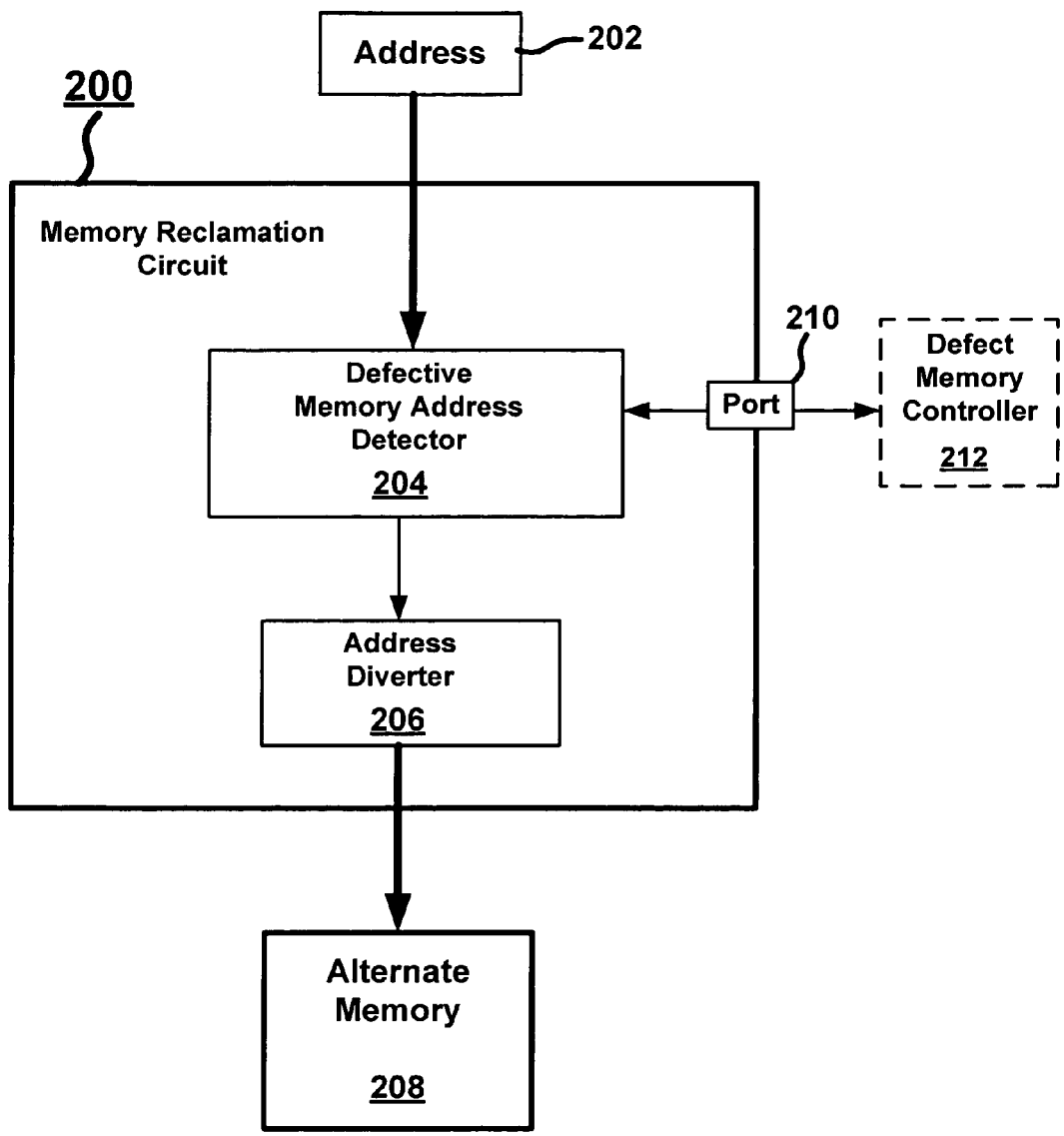
FIG. 2 is a block diagram detailing an example of a memory reclamation circuit, according to one embodiment of the invention.

FIG. 2 is a block diagram detailing an example of a memory reclamation circuit, according to one embodiment of the invention. In this example, memory reclamation circuit 200 includes a defective memory address detector 204 configured to detect an address 202 for accessing a memory location having a defect in one or more third dimension memory cells. Upon detecting address 202 for a defective memory, defective memory address detector 204 identifies an alternate memory location for substituting the defective memory location. Also, defective memory address detector 204 sends an address of the alternate memory location to an access diverter 206, which is configured to divert the access to the alternate memory location in alternate memory. Access diverter 206 can be configured to divert write operations to an alternate memory 208 (e.g., to write data) and to divert read operations from the alternate memory 208 (e.g., to read data). In one embodiment, memory reclamation circuit 200 is configured to convert address 202, which is associated with the defective memory location, into an alternate memory address identifying substitute memory cells.

In one embodiment, memory reclamation circuit 200 includes a port 210 configured to receive address 202 from a defect memory controller 212. In operation, defect memory controller 212 tests the main memory array for defects, identifies those defects and stores the defective memory addresses in, for example, a defective memory list in or associated with defective memory address detector 204. In some cases, defect memory controller 212 can be production test equipment configured to program defective memory address detector 204 at, for example, wafer sort. In other cases, defect memory controller 212 can be integrated into a circuit including memory reclamation circuit 200, thereby providing for in-situ defect reclamation in view of defects arising during use in memory applications.

Figure 3:
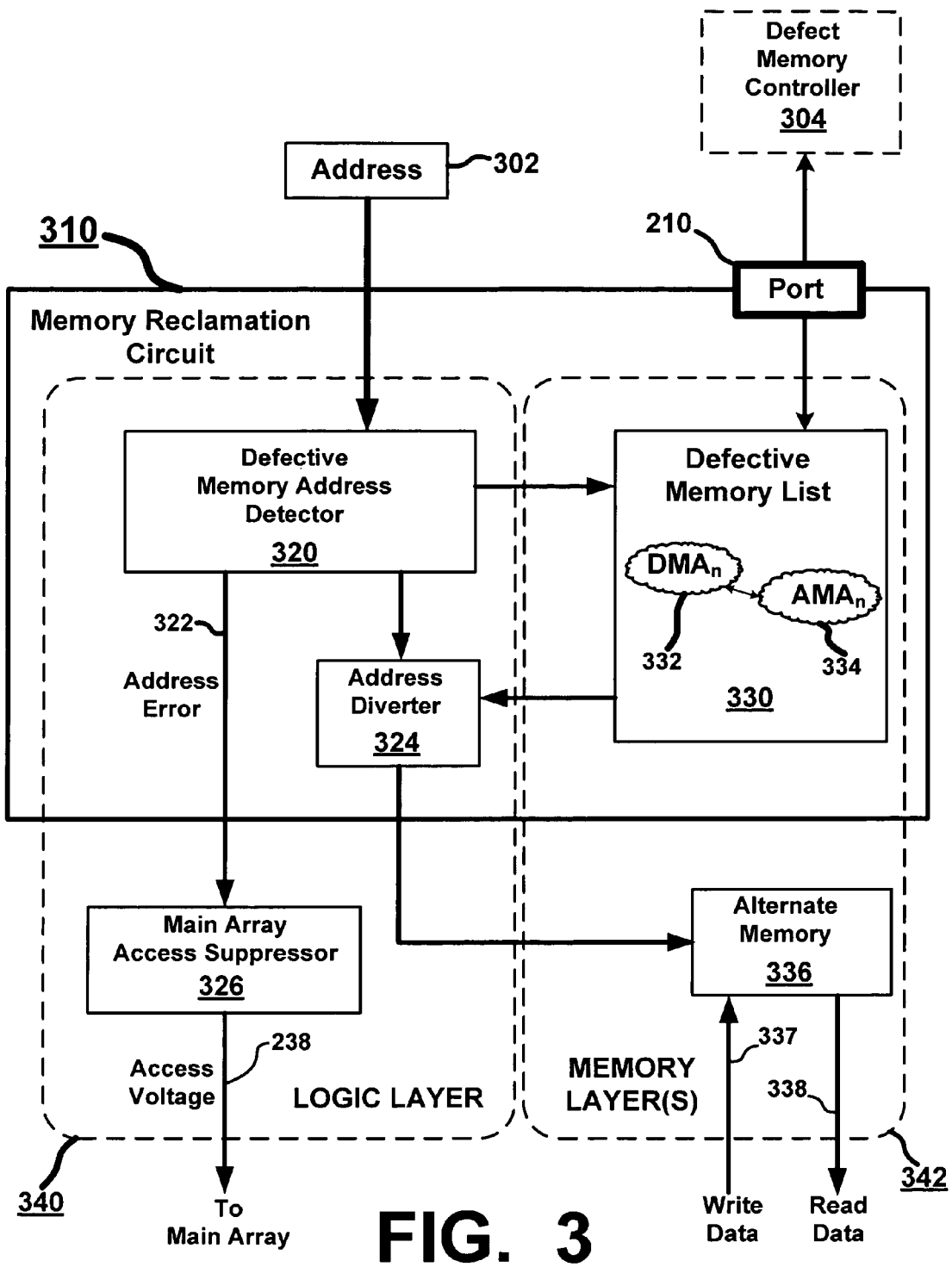
FIG. 3 is a block diagram detailing another example of a memory reclamation circuit, according to another embodiment of the invention.

FIG. 3 is a block diagram detailing another example of a memory reclamation circuit, according to another embodiment of the invention. In this example, memory reclamation circuit 310 includes a defective memory address detector 320, an access diverter 324 and storage for a defective memory list 330. Initially, defect memory controller 212 operates to program N number of defective memory addresses ("DMAn") 332 via port 210 into defective memory list 330. Each of defective memory addresses 332 corresponds to an alternate memory address ("AMAn") 334. In operation, defective memory address detector 320 is configured to detect an address 302 for accessing a memory location having a defect. In one embodiment, defective memory address detector 320 performs a comparison between address 302 and defective memory addresses 332 to determine a match. Upon detecting address 302, defective memory address detector 320 uses the defective memory address 332 to identify alternate memory address 334, which is sent to access diverter 324. In a specific embodiment, memory reclamation circuit 310 converts address 302 into an alternate memory address 334 identifying substitute memory cells in an alternate memory 336.

Access diverter 324 can be configured to use alternate memory address 334 to divert the access from the defective memory location in the main memory array to the alternate memory location in alternate memory. Specifically, access diverter 324 can operate to divert the write data 337 to, and read data 338 from, alternate memory 336.

In some embodiments, memory reclamation circuit 310 includes a first portion 340 formed in a logic layer and a second portion 342 being formed in one or more layers in a third dimension memory. In particular, first portion 340 can include at least a portion of defective memory address detector 320 and at least a portion of access diverter 324, and second portion 342 can include storage for a defective memory list 330 and alternate memory locations in alternate memory 336. Both portions 340 and 342 can be formed using a CMOS fabrication process. In at least one embodiment, a portion of defective memory address detector 320 can include a part of defective memory list 330 (e.g., defective memory addresses 332 and/or relationships to alternate memory address 334), and a portion of access diverter 324 can include another part of defective memory list 330 (e.g., alternate memory address 334).

Further to the example shown, defective memory address detector 320 generates an address error signal 332 configured to suppress access to the defective memory location. As such, defective memory address detector 320 can be configured to suppress the access to the memory location in the main memory array coincident, or substantially coincident, to access diverter 324 diverting the access to alternate memory 336. In one embodiment, an integrated circuit including memory reclamation circuit 310 also contains a main array access suppressor 326. Responsive to address error signal 326, main array access suppressor 326 is configured to suppress application of an access voltage 238 to a main array (not shown) of third dimension memory cells. Access voltage 238 includes write voltages and/or read voltages. Note that alternate memory 336 can reside in memory reclamation circuit 310 in some embodiments.

Figure 4:
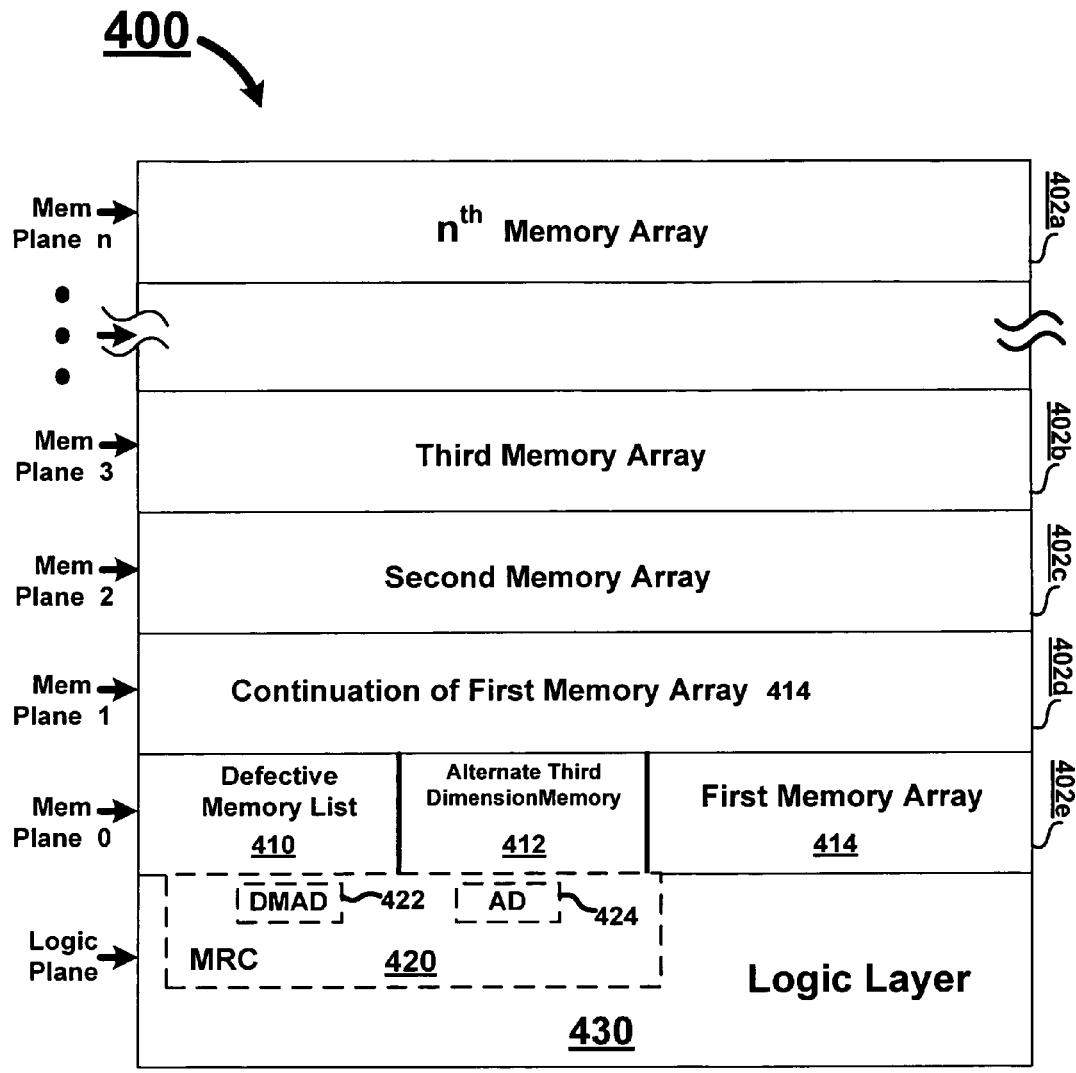
FIG. 4 depicts a cross-section view of an example of an integrated circuit implementing a memory reclamation circuit, according to one embodiment of the invention.

FIG. 4 depicts a cross-section view of an example of an integrated circuit implementing a memory reclamation circuit, according to one embodiment of the invention. Cross-section view 400 shows multiple memory layers being vertically disposed above or on a logic layer 430, which can include logic circuitry for implementing defective memory replacement, and a semiconductor substrate upon which the logic circuitry can be formed. The logic circuitry, for example, can include a memory reclamation circuit ("MRC") 420 having a defective memory address detector circuit ("DMAD") 422 and an access diverter circuit ("AD") 424. Multiple memory layers can include a first layer 402e having a first group 410 and a second group 412 of third dimension memory cells operable as a defective memory list and an alternate third dimension memory, respectively. Note that the first group 410 and the second group 412 of third dimension memory cells can be placed in other memory planes or sub-planes, and therefore, need not be restricted to layer 402e. First layer 402e also contains a portion of a first memory array 414, which continues into second layer 402d of third dimension memory cells. A third layer 402c, a fourth layer 402b and an Nth layer 402a include third dimension memory cells for a second array, a third array, and an Nth array, respectively. In other embodiments, the multiple memory layers shown in cross-section view 400 can include more or fewer layers than as shown in FIG. 4, any of which can emulate other types of memory technologies. Note that in this example each of the multiple memory layers is oriented in the X and Y plane, each plane being designated by "Mem Plane." Logic layer 430 is shown to lie in a base plane designated as "logic plane."

Figure 5:
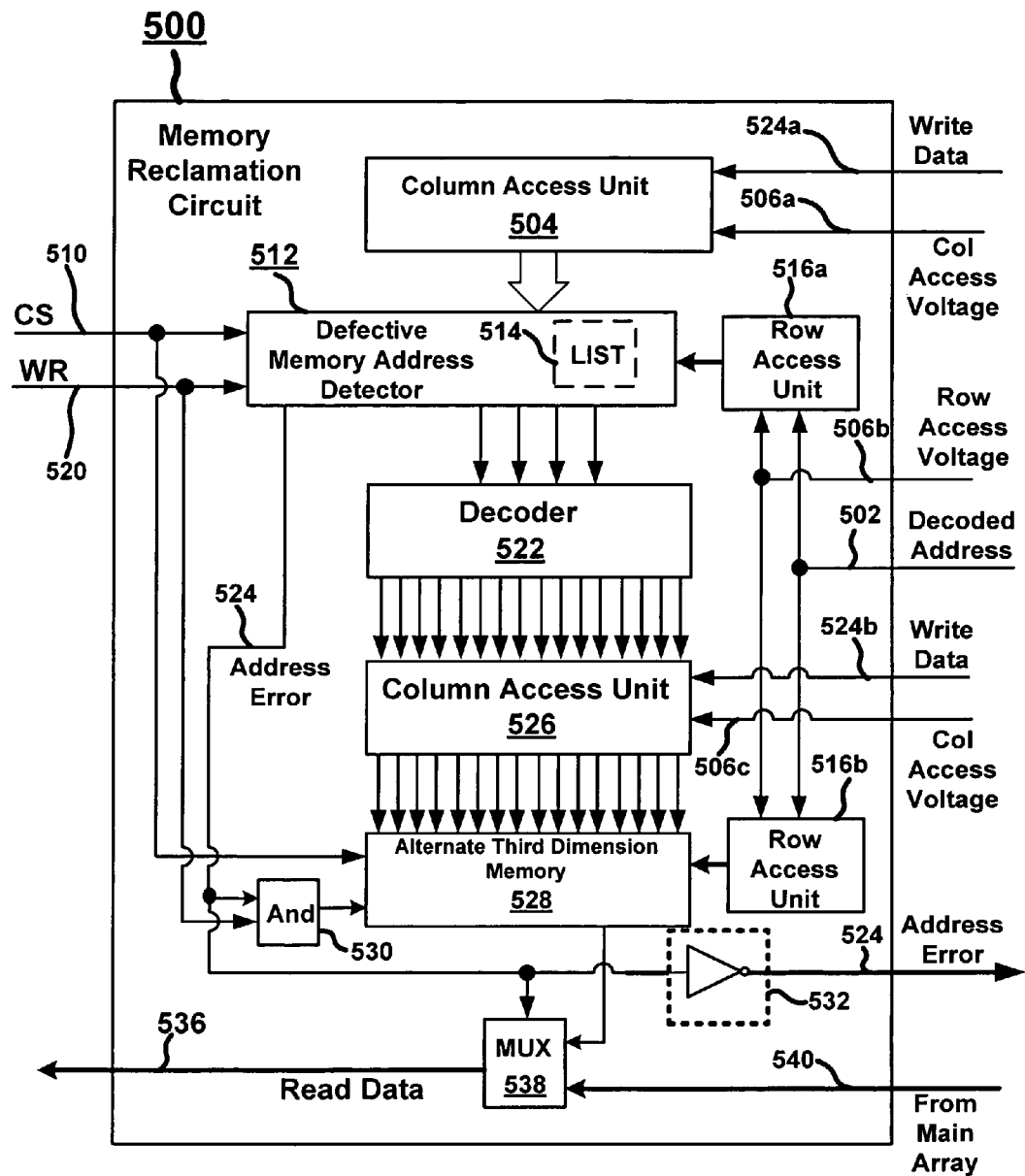
FIG. 5 depicts an example of a memory reclamation circuit, according to one embodiment of the invention.

FIG. 5 depicts an example of a memory reclamation circuit, according to one embodiment of the invention. Memory reclamation circuit 500 includes a first column access unit 504, a defective memory address detector 512, a decoder 522, a second column access unit 526, an alternate third dimension memory 528, and two row access units 516a and 516b. Memory reclamation circuit 500 is configured to operate in two modes: a programming mode and a functional mode.

In programming mode, a defective memory list ("LIST") 514 is programmed into defective memory address detector 512 to record a list of defective memory locations requiring substitution. A decoded address 502 selects the row into which write data 524a is to be programmed. In programming mode, write data 524a represents a defective memory address and at least a relationship to an alternate memory address. To initiate programming, a chip select signal ("CS") 510 and write enable signal ("WR") 520 can be applied to memory reclamation circuit 500 to program a third dimension memory constituting list 514. Column access unit 504 and row access unit 516a cooperate to program list 514. For example, column access unit 504 can logically AND a column access voltage 506a (e.g., a "col, write voltage") with select address bits of decoded address 502 to determine which column lines (e.g., Y-lines) will be driven with write data 524a. In one example, the select column bits are determined by a column decoder (not shown). Row access unit 516a performs a similar function, but rather determines a unique row for programming. For example, row access unit 516a can logically AND a row access voltage 506b (e.g., a "row write voltage") with select decoded row bits, thereby applying voltages to a unique row line (e.g., X-line). Note that AND gate 530 prevents programming of alternate third dimension memory 528 during programming mode. The functionality of AND gate 530 is discussed below. In one embodiment, the addresses in list 514 can be set to be above the memory address range of the main memory array to avoid access to the main array during programming mode. In various embodiments, the magnitudes of the access voltages for the columns and row can be set to values that are appropriate for third dimension memory cells, for example.

In functional mode, alternate third dimension memory 528 is accessed during write and read operations to defective memory. But first consider write operations and read operations in connection with non-defective memory in the main array (not shown). During write operations to non-defective memory, defective memory address detector 512 does not generate an active address error signal 524 (e.g., it is low). For write operations, defective memory address detector 512 generates address error signal 524 having a low state during a write to non-defective memory. It is the low state of address error signal 524 in this example that disables write enable signal 520 at AND gate 530. The inactive, or low, state of address error signal 524 bars writes to alternate third dimension memory 528. For read operations to non-defective memory, a low address error signal 524 causes multiplexer ("MUX") 538 to route read data 540, which originates from the main array, through as read data 536.

Now consider write operations and read operations with defective memory in the main array. In both cases, defective memory address detector 512 generates an active address error signal 524 (e.g., it is high) upon detection of an access to defective memory. For write operations, defective memory address detector 512 generates an active address error signal 524 (e.g., it is in a high state) during write operations, which is ANDed with write enable signal 520. The output of AND gate 530 enables writes to alternate third dimension memory 528 as substitute memory. For read operations, address error signal 524 in a high state causes multiplexer 538 to block read data 540 and to send read data 536 from alternate third dimension memory 528.

When access to a defective memory address is detected, memory reclamation circuit 500 transmits address error signal 524 to suppress at least the write and read operations with the main array. Also, memory reclamation circuit 500 accesses list 514 to determine an alternate memory address. Both of these events can occur in parallel (or substantially in parallel). In operation, read voltage levels generated by both column access voltage 506a and row access unit 516a, as well as decoded address 502, are applied to list 514. List 514 is then examined in parallel with main array access operations.

If memory reclamation circuit 500 detects a defective memory address, a corresponding alternate memory address for that defective memory address will be generated to divert access from a specific memory location in the main array to an alternate memory location in alternate third dimension memory 528. Defective memory address detector 512 transmits bits representing an alternate memory address to decoder 522, which, in turn, uses this encoded alternate memory address to activate a single line for accessing a row of alternate third dimension memory 528. For example, if the alternate memory address can be represented by fours bits to cover addresses 0000 to 1111 (e.g., addresses 0 to 16), decoder 522 will output a signal on one of 16 lines. It is understood that different numbers of bits can be used across different memory designs and can be large in quantity than in the previous example. In one embodiment, address error signal 524 can be inverted for external use using inverter 532.

If the access operation is a write operation, AND gate 530 provides a write enable signal 520 to alternate third dimension memory 528. Also, column access voltage 506c is applied to column access unit 526, and a row access voltage 506b is applied to row access unit 516b, whereby the access voltages can provide for writing of write data 524b into an alternate memory location, rather then the main array. But if the access operation is a read operation, both column access voltage 506c and row access voltage 506b are applied at access voltage magnitudes that are sufficient to output data via MUX 538 as read data 536. In various embodiments, one or more of the following can constitute an access diverter: decoder 522, logic for diverting write operations and read operations, such as AND gate 530, with alternate third dimension memory 528, column access unit 526, row access unit 516b, and any other circuit that can—in whole or in part—divert access from the main array to an alternate memory.

Figure 6:
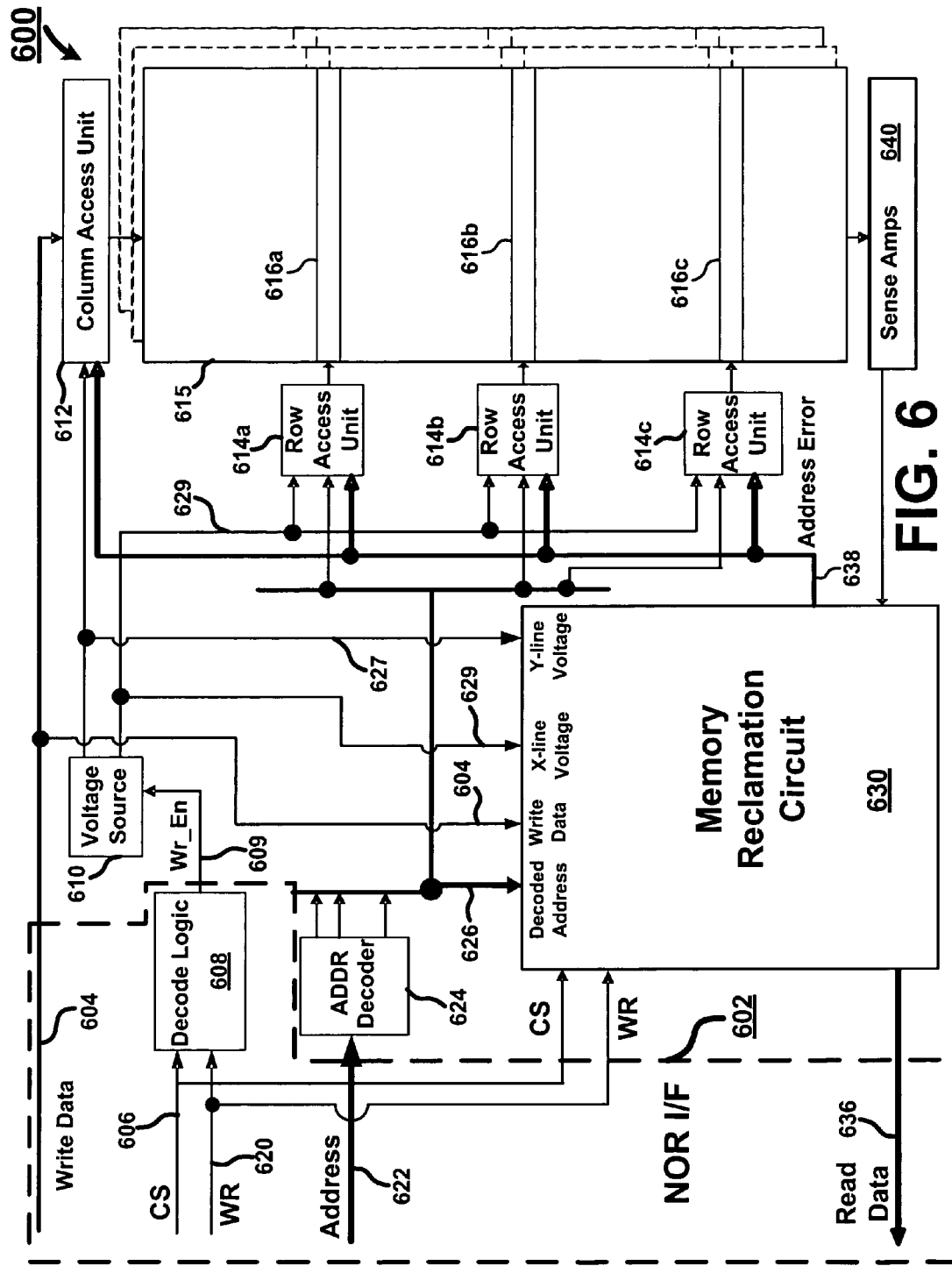
FIG. 6 depicts an example of a memory reclamation circuit implemented in a memory architecture that includes a NOR-type interface, according to one embodiment of the invention.

FIG. 6 depicts an example of a memory reclamation circuit implemented in a memory architecture that includes a NOR-type interface, according to one embodiment of the invention. As shown, memory architecture 600 includes a NOR-type interface ("NOR I/F") 602, an address ("ADDR") decoder 624, a voltage source 610, a column access unit 612, a number of row access units 614, sense amplifiers ("Amps") 640 and a third dimension memory array 615. Memory reclamation circuit 630, which operates in accordance to various embodiments as described herein, is configured to reclaim memory having defects in array 615 that otherwise would be rendered unavailable.

Address ("ADDR") decoder 624 is configured to decode address 622 into a decoded address 626, which relates to one of the outputs of address decoder 624. Voltage source 610 is configured to generate read voltages and write voltages as row access voltage ("X-line Voltage") 629 and column access voltage ("Y-line Voltage") 627, both of which can be applied to row access units 614 and column access units 612, respectively. Row access units 614 and column access units 612 operate in an equivalent manner as similarly-named elements described in FIG. 5. Row access units 614a, 614b, and 614c each operate to uniquely select a row, such as rows 616a, 616b, and 616c, respectively. In the example shown, memory reclamation circuit 630 is configured to transmit an address error signal 638 to each row access unit 614 and column access unit 612 to disable writes and reads to array 615, when an access relates to defective memory. For example, decoded address 626, row access voltage 629 and address error signal 638 can be logically ANDed together such that when address error signal 638 is low, all accesses to the rows 616 are disabled. Sense amplifiers ("Amps") 640 are configured to sense and generate read data for transmission as read data 636, when an access to array 615 relates to non-defective memory.

NOR-type interface ("NOR I/F") 602 is configured to provide control signals, address signals and data signals for accessing third dimension memory in either array 615 or alternate memory in memory reclamation circuit 630, or both. As shown, NOR-type interface 602 is adapted to provide separate channels for write data 604, address data 622, and read data 636. Further, NOR-type interface 602 provides channels for chip select ("CS") 606 and write enable ("WR") 620 signals. NOR-type interface 602 includes decode logic 608 for generating an internal write enable signal ("Wr_En") 609 to cause voltage source 610 to transmit write and/or read access voltages. As different memory technologies can implement NOR-type interfaces 602, such as SRAM devices, memory architecture 600 can emulate SRAM memory technologies, as well as NOR Flash memory technologies and the like. As such, the alternate memory in memory reclamation circuit 630 can be divided into individually-addressable bytes as subsets of substitute memory. Note that NOR-type interface 602 can implement more or fewer signals, as necessary, to emulate different memory technologies. Note, too, that while FIG. 6 depicts array 615 as one memory plane (e.g., implement in one layer of multiple memory layers), other arrays 615 in the Z dimension are shown in dashed lines.

Figure 7:
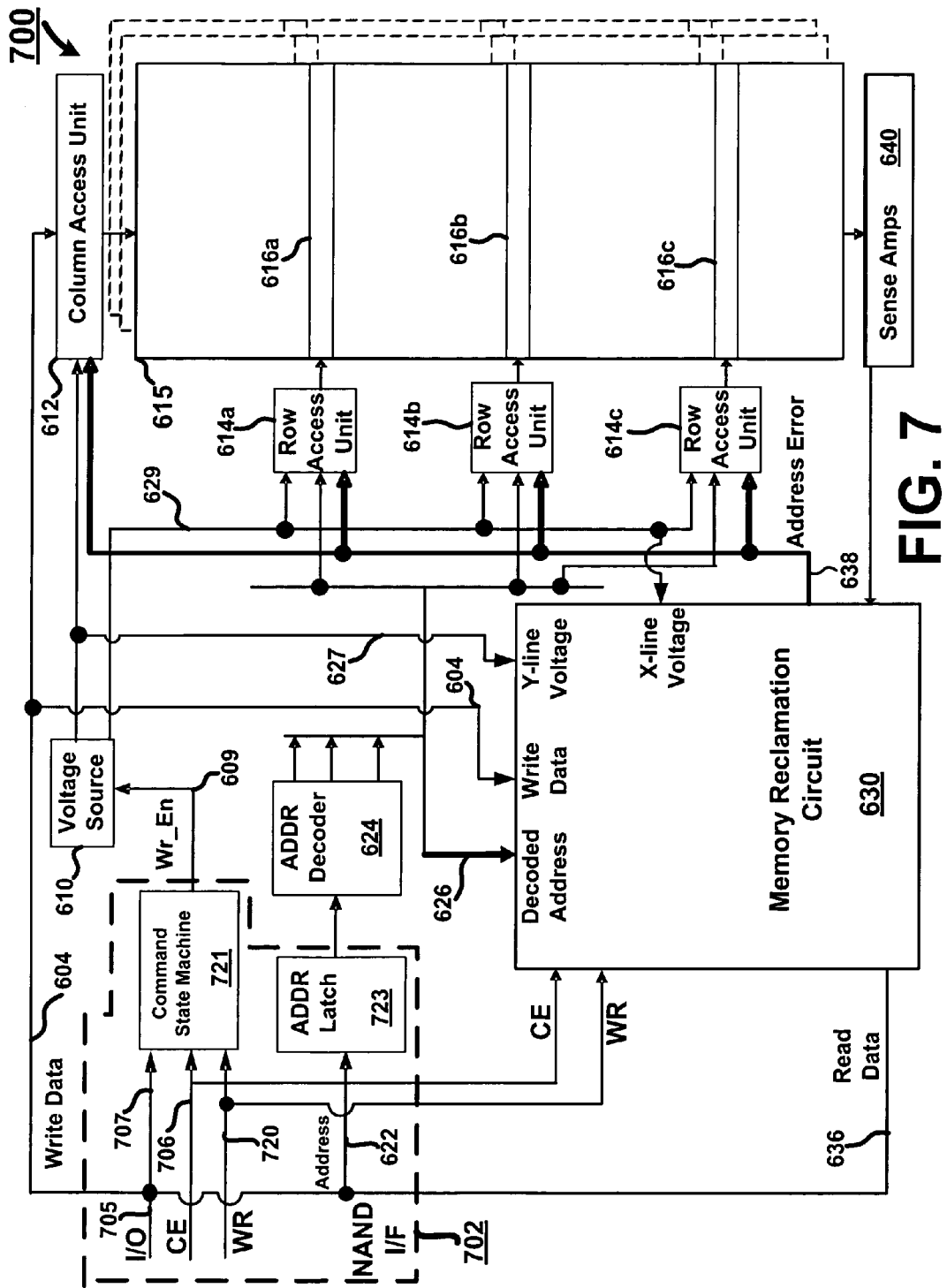
FIG. 7 depicts an example of a memory reclamation circuit implemented in a memory architecture that includes a NAND-type interface, according to another embodiment of the invention.

FIG. 7 depicts an example of a memory reclamation circuit implemented in a memory architecture that includes a NAND-type interface, according to another embodiment of the invention. As shown, memory architecture 700 includes a NAND-type interface ("NAND I/F") 702, as well as an address ("ADDR") decoder 624, a voltage source 610, a column access unit 612, a number of row access units 614, sense amplifiers ("Amps") 640, a third dimension memory array 615, and memory reclamation circuit 630. Note that elements in FIG. 7 that are also shown in FIG. 6 have similar functions and/or structures.

NAND-type interface ("NAND I/F") 702 is configured to provide control signals, address signals and data signals for accessing third dimension memory in either array 615 or alternate memory in memory reclamation circuit 630, or both. As shown, NAND-type interface 702 is adapted to provide a shared bus for write data 604, address data 622, read data 636, and command data 707 constituting commands. The shared bus is shown as I/O bus 705. Further, NAND-type interface 702 provides channels for chip enable ("CE") 706 and write enable ("WR") 720 signals. NAND-type interface 702 includes command state machine 721 configured to implement commands for performing, for example, write and read operations. When writing, command state machine 721 can generate, for example, an internal write enable signal ("Wr_En") 609. Address latch ("ADDR latch") 723 is configured to receive an address 622, generally over multiple bus cycles, and latched until used. Note that NAND-type interface 702 can implement more or fewer signals, as necessary, to emulate different memory technologies. Examples of such signals include address latch enable and command enable signals.

As different memory technologies can implement NAND-type interfaces 702, such as DRAM devices, memory architecture 700 can emulate DRAM memory technologies, as well as NAND Flash memory technologies and the like. Consider, for example, that memory architecture 700 is configured to emulate NAND Flash memory. As such, array 615 can be partitioned into blocks with memory cell replacement being made at the sector-level (e.g., row-level), in some embodiments. In at least one embodiment, memory cell replacement can be in groups of memory cells, such as a byte. Or, memory cell replacement can be individually replaced. In at least one embodiment, implementation of memory reclamation circuit 630 becomes more cost-effective as the number of memory cells (e.g., bits) in each row increases. In particular, the ratio of error and alternate bits to main memory gets smaller as the width of array 615 increases. Thus, increased efficiency can be realized in arrays having relatively long word lines. Note that this is typically the case in relation to NAND Flash memory designs for which memory architecture 700 emulates. In one instance, row 616a can include 512 bytes or more bytes. As such, the alternate memory in memory reclamation circuit 630 can be divided into individually-addressable sectors, or rows, of 512 bytes as subsets of substitute memory.

Figure 8:
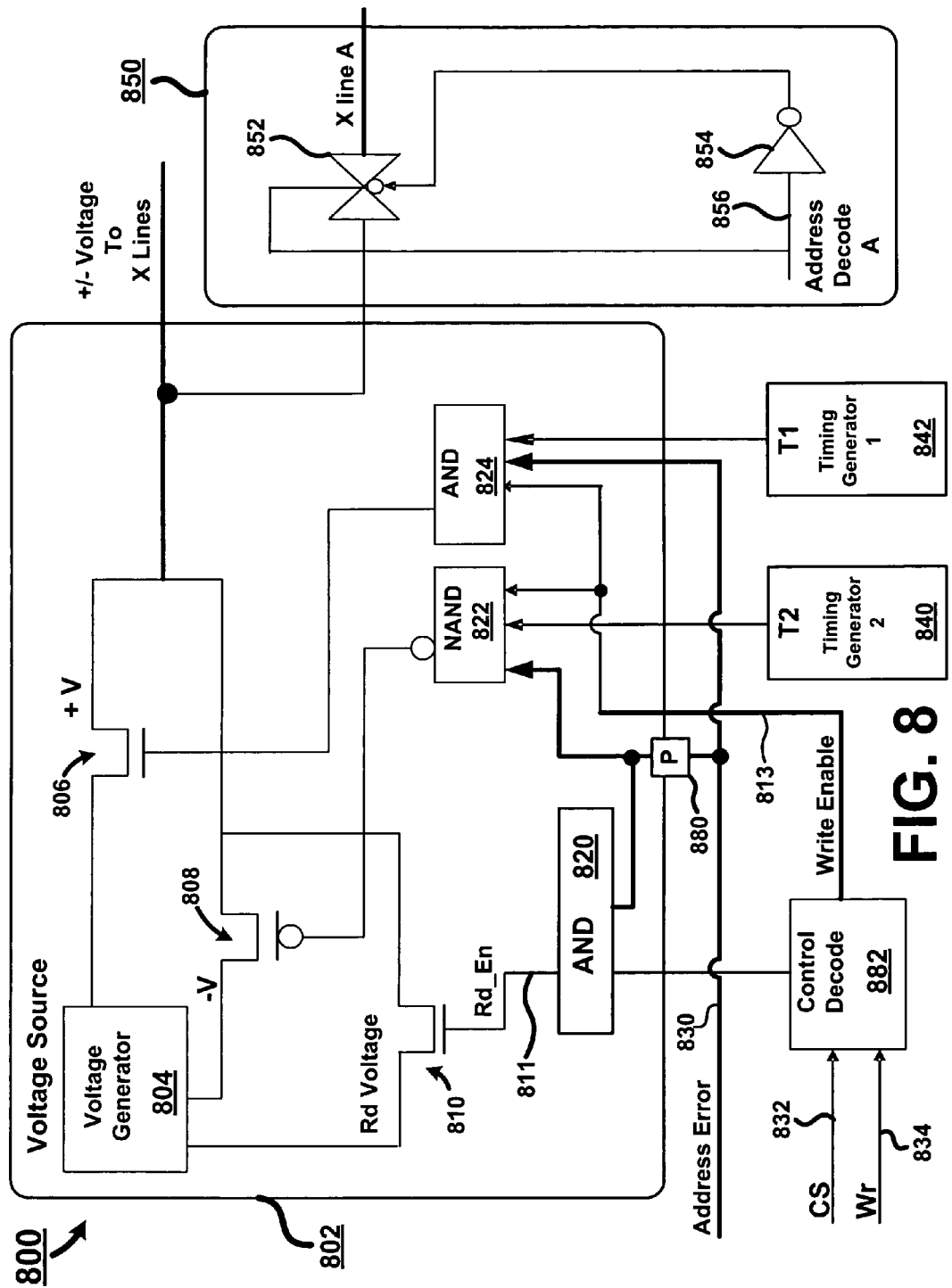
FIG. 8 is a diagram depicting an example of a voltage source for use with a memory reclamation circuit, according to an embodiment of the invention.

FIG. 8 is a diagram depicting an example of a voltage source for use with a memory reclamation circuit, according to an embodiment of the invention. In the example shown, voltage source 800 can be configured as an interruptible voltage source having an address error port ("P") 880. As such, interruptible voltage source 802, which typically provides access voltages to a main array, can be interrupted so as to suppress the transmission of the access voltages in response to an address error signal 830 at address error port 880. In this example, address error signal 830 need not be routed to row access units and column access units as described in other embodiments.

Voltage source 800 includes a voltage generator 804 configured to generate read voltages and write voltages as access voltages. It also includes devices 810, 808, and 806 for disabling transmission of access voltages to, for example, a row having a defect. Logic circuits 820, 822, and 824 are configured to respectively control operation of devices 810, 808, and 806 in response to address error signal 830 that, when low, disables reads and writes to a particular row. Control decode 882 generates read enable signals 811 when, for example, chip select ("CS") signal 832 is active, but write enable ("Wr") 834 is inactive. But when write enable 834 is active, internal write enable signal 813 enables writes to the main array. Timing generator ("1") 842 and timing generator ("2") 840 cooperate, when address error signal 830 is high (e.g., inactive), to generate timing signals to control the alternate application of negative write voltages ("−V") to write zeroes and positive write voltages ("+V") to write ones. Writing in this manner, at least for some third dimension memory cells, is a two-cycle operation with a positive voltage applied at T1 and a negative voltage applied at T2, both producing the positive and negative voltages driven down the row line selected by an address decode signal ("A") 856, which implements a circuit 850 to send an access voltage down the row for reading. Circuit 850 is an example of a gating circuit that includes an inverter 854 and a transmission gate 852, which enables transmission of a row access voltage to a single row as determined by address decode signal 856.

The invention can be implemented in numerous ways, including as a system, a process, an apparatus, or a series of program instructions on a computer readable medium such as a computer readable storage medium or a computer network where the program instructions are sent over optical or electronic communication links. In general, the steps of disclosed processes may be performed in an arbitrary order, unless otherwise provided in the claims.

The foregoing description, for purposes of explanation, used specific nomenclature to provide a thorough understanding of the invention. However, it will be apparent to one skilled in the art that specific details are not required in order to practice the invention. In fact, this description should not be read to limit any feature or aspect of the present invention to any embodiment; rather features and aspects of one embodiment can readily be interchanged with other embodiments.

Thus, the foregoing descriptions of specific embodiments of the invention are presented for purposes of illustration and description. They are not intended to be exhaustive or to limit the invention to the precise forms disclosed; many alternatives, modifications, equivalents, and variations are possible in view of the above teachings. For the purpose of clarity, technical material that is known in the technical fields related to the embodiments has not been described in detail to avoid unnecessarily obscuring the description. Thus, the various embodiments can be modified within the scope and equivalents of the appended claims. Further, the embodiments were chosen and described in order to best explain the principles of the invention and its practical applications; they thereby enable others skilled in the art to best utilize the invention and various embodiments with various modifications as are suited to the particular use contemplated. Notably, not every benefit described herein need be realized by each embodiment of the present invention; rather any specific embodiment can provide one or more of the advantages discussed above. In the claims, elements and/or operations do not imply any particular order of operation, unless explicitly stated in the claims. It is intended that the following claims and their equivalents define the scope of the invention.

What is claimed is:

1. An integrated circuit configured to compensate for defective memory, comprising:
    a memory including two-terminal memory cells disposed in multiple layers of memory; and
    a memory reclamation circuit configured to operate in a programming mode and a functional mode,
    the programming mode operative to receive defective memory location data indicative of address data for one or more defective memory cells in the memory and to write the defective memory location data to a defective memory list included in a first portion of the memory, and
    the functional mode operative to receive a memory address for a data operation on the memory and to activate an address error signal if the memory address matches the defective memory location data in the defective memory list and configured to substitute a subset of the memory cells in the memory for the one or more defective memory cells.

2. The integrated circuit of claim 1, wherein the memory cells comprise third dimension memory cells.

3. The integrated circuit of claim 1, wherein the memory reclamation circuit is further configured to vary an amount of the memory cells to reclaim memory in regions having different numbers of defects per region.

4. The integrated circuit of claim 3, wherein each of the regions comprises a layer of memory in the multiple layers of memory.

5. The integrated circuit of claim 1, wherein the memory reclamation circuit is further configured to implement the subset of the memory cells to replace defective memory cells located anywhere in the memory.

6. The integrated circuit of claim 1, wherein the memory reclamation circuit is further configured to identify the subset as a substitute for the one or more defective memory cells.

7. The integrated circuit of claim 1, wherein the memory reclamation circuit is further configured to
    detect an access to the one or more defective memory cells, and
    divert the access to the subset of the memory cells substantially in parallel with the access.

8. The integrated circuit of claim 7, wherein the access includes a write to or a read from the one or more defective memory cells.

9. The integrated circuit of claim 1 and further comprising:
    a logic layer including at least a portion of the memory reclamation circuit, the multiple layers of memory being formed on top of the logic layer.

10. The integrated circuit of claim 9 and further comprising: a substrate upon which the logic layer is fabricated, the multiple layers of memory being fabricated directly on top of the substrate using the same fabrication process used to fabricate the logic layer on the substrate.

11. The integrated circuit of claim 10, wherein the subset of the memory cells are spatially arranged in one of the multiple layers of memory.

12. The integrated circuit of claim 1, wherein the subset of the memory cells has a spatial arrangement different than that of the one or more defective memory cells.

13. The integrated circuit of claim 1, wherein the subset of the memory cells constitute a spare row.

14. The integrated circuit of claim 1, wherein the subset of the memory cells constitute a spare portion of a row.

15. The integrated circuit of claim 1, wherein the subset of the memory cells constitute a spare block of memory.

16. The integrated circuit of claim 1, wherein the multiple layers of memory further comprises a vertically-stacked arrangement of third dimension memory cells.

17. The integrated circuit of claim 1, wherein the memory cells each comprises a two-terminal memory element that changes conductivity as a function of a voltage differential between a first terminal and a second terminal.

18. The integrated circuit of claim 1, wherein the multiple layers of memory comprise memory elements that are each formed with an electrolytic tunnel barrier and a mixed valence conductive oxide.

19. The integrated circuit of claim 1, wherein the memory includes a third dimension memory array configured as a stacked cross point array.

20. An integrated circuit configured to compensate for defective memory, comprising:
a memory reclamation circuit configured to operate in a programming mode and a functional mode, and including
a defective memory address detector configured
in the programming mode to detect an address for accessing a memory location in a third dimension memory that includes a defect and
in the functional mode to activate an address error signal configured to suppress access to the memory location, and
an access diverter configured to divert the access to an alternate memory location when the address error signal is activated.

21. The integrated circuit of claim 20, wherein the defective memory address detector is further configured to suppress the access to the memory location substantially coincident to the access diverter diverting the access to the alternate memory location.

22. The integrated circuit of claim 20 and further comprising:
a first portion formed in a logic layer and a second portion being formed in one or more layers in the third dimension memory.

23. The integrated circuit of claim 22, wherein the first portion includes at least a portion of the defective memory address detector and at least a portion of the access diverter, and the second portion includes a defective memory list and the alternate memory location.

24. The integrated circuit of claim 22, wherein the first and the second portions of the integrated circuit are formed using a CMOS fabrication process.

25. The integrated circuit of claim 20, wherein the memory reclamation circuit further comprises a defective memory list that associates defective memory addresses with alternate memory addresses.

26. The integrated circuit of claim 20, wherein the memory reclamation circuit is further configured to convert the address into an alternate memory address.

27. The integrated circuit of claim 20 and further comprising:
a main array access suppressor being responsive to the address error signal, the main array access suppressor being configured to suppress application of an access voltage to a main array of the third dimension memory.

28. The integrated circuit of claim 20 and further comprising:
a defect memory controller;
a defective memory list operative to store a defective memory address; and
a port configured to receive the address from the defect memory controller,
wherein the memory reclamation circuit, when in the programming mode, is configured to program the address as the defective memory address in the defective memory list.

29. The integrated circuit of claim 28, wherein the defect memory controller is further configured for in-situ defect reclamation.

30. The integrated circuit of claim 20 and further comprising:
a single memory reclamation circuit.

31. An integrated circuit including spare memory to compensate for memory defects, comprising:
a logic layer including circuitry formed on a substrate;
a third dimension memory connected with the substrate and electrically coupled with the circuitry, the third dimension memory including
an alternate memory including subsets of third dimension memory cells, the alternate memory is accessible for data operations when a portion of the circuitry is in a functional mode and an address for a data operation matches an address for one or more defective memory addresses, and
a portion of the third dimension memory configured to store a defective memory list that includes address data for the one or more defective memory addresses; and
an interface configured to provide control signals, address signals, and data signals to the third dimension memory for accessing the alternate memory,
wherein the subsets of third dimension memory cells are substitutes for storing data at memory addresses that are associated with defects in a main array of the third dimension memory.

32. The integrated circuit of claim 31, wherein the circuitry, further comprises a defective memory address detector and an access diverter.

33. The integrated circuit of claim 31, wherein the interface further comprises a NOR-type interface.

34. The integrated circuit of claim 31, wherein the interface further comprises a NAND-type interface.

35. The integrated circuit of claim 31 and further comprising:
an interruptible voltage source included in the circuitry and including an address error port, the interruptible voltage source being configured to provide an access voltage to the main array that can be suppressed in response to an address error signal at the address error port.

36. A method for reclaiming defective memory, comprising:
activating a functional mode for an access operation to memory in multiple layers of third dimension memory, the functional mode operative when an address error signal is active to compensate for defective memory in the multiple layers of third dimension memory and operative when the address error signal is not active to perform the access operation on non-defective memory in the multiple layers of third dimension memory;
detecting the access operation in relation to a memory location in a first plane of memory in multiple layers of third dimension memory; and
substituting for the memory location an alternate memory location in a second plane of memory in the multiple layers of the third dimension memory to facilitate the access operation, the substituting occurring while the address error signal is active.

37. The method of claim 36, wherein the substituting comprises
generating an alternate memory address in response to the access operation, and
accessing the alternate memory location.

38. The method of claim 36 and further comprising: performing a selected one of a write operation, a read operation, or both a write operation and a read operation as the access operation.

39. The method of claim 36 and further comprising:
activating a programming mode operative to perform defective memory detection in the multiple layers of third dimension memory;
identifying defects in the multiple layers of third dimension memory; and
associating addresses having the defects with alternate addresses.

40. The method of claim 39 and further comprising: storing the addresses having the defects as data representing a defective memory list.

41. The method of claim 38 and further comprising:
forming at least a portion of a defective memory address detector and at least a portion of an access diverter to form a portion of a logic layer including circuitry fabricated on a substrate; and
forming multiple layers of memory directly, on top of the substrate, the multiple layers of memory comprising third dimension memory cells.

* * * * *

UNITED STATES PATENT AND TRADEMARK OFFICE
CERTIFICATE OF CORRECTION

| | |
|---|---|
| PATENT NO. | : 7,796,451 B2 |
| APPLICATION NO. | : 12/001335 |
| DATED | : September 14, 2010 |
| INVENTOR(S) | : Robert Norman |

Page 1 of 1

It is certified that error appears in the above-identified patent and that said Letters Patent is hereby corrected as shown below:

In FIG. 2 of the Drawings, for element 206, please Replace the words "Address Diverter" with the Correct words "Access Diverter"

In FIG. 3 of the Drawings, for element 324, please Replace the words "Address Diverter" with the Correct words "Access Diverter"

Signed and Sealed this

Twenty-first Day of December, 2010

David J. Kappos
*Director of the United States Patent and Trademark Office*